United States Patent
Porthun (10) Patent No.: US 8,914,909 B2
(45) Date of Patent: Dec. 16, 2014

(54) FREQUENCY MEASURING AND CONTROL APPARATUS WITH INTEGRATED PARALLEL SYNCHRONIZED OSCILLATORS

(75) Inventor: Steffen Porthun, Teltow (DE)

(73) Assignee: RHK Technology, Inc., Troy, MI (US)

( * ) Notice: Subject to any disclaimer, the term of this patent is extended or adjusted under 35 U.S.C. 154(b) by 128 days.

(21) Appl. No.: 13/583,952

(22) PCT Filed: Mar. 17, 2011

(86) PCT No.: PCT/US2011/028859
§ 371 (c)(1),
(2), (4) Date: Sep. 11, 2012

(87) PCT Pub. No.: WO2011/116218
PCT Pub. Date: Sep. 22, 2011

(65) Prior Publication Data
US 2013/0007929 A1    Jan. 3, 2013

Related U.S. Application Data

(60) Provisional application No. 61/315,823, filed on Mar. 19, 2010.

(51) Int. Cl.
| | |
|---|---|
| *G01Q 30/00* | (2010.01) |
| *H03L 7/08* | (2006.01) |
| *G01R 23/02* | (2006.01) |
| *G01Q 30/04* | (2010.01) |
| *G01Q 10/06* | (2010.01) |
| *B82Y 35/00* | (2011.01) |
| *G01R 23/06* | (2006.01) |
| *G01R 23/12* | (2006.01) |
| *G01R 23/15* | (2006.01) |

(52) U.S. Cl.
CPC ........... *G01Q 10/06* (2013.01); *G01R 23/02* (2013.01); *B82Y 35/00* (2013.01); *G01R 23/06* (2013.01); *G01Q 30/04* (2013.01); *G01R 23/12* (2013.01); *G01Q 30/00* (2013.01); *G01R 23/155* (2013.01); *G01Q 10/065* (2013.01)
USPC .................................. 850/8; 327/150; 850/10

(58) Field of Classification Search
CPC ....... G01R 23/14; G01R 23/155; G01R 23/12; G01R 23/02; G01R 23/06; B82Y 35/00; G01Q 10/06; G01Q 10/065; G01Q 30/00; G01Q 30/04
USPC .......................................... 850/8, 10; 327/150
See application file for complete search history.

(56) References Cited

U.S. PATENT DOCUMENTS

| | | | | |
|---|---|---|---|---|
| 5,744,799 | A * | 4/1998 | Ohara ............................... | 850/3 |
| 6,215,121 | B1 * | 4/2001 | Fujihira et al. ................... | 850/1 |

(Continued)

OTHER PUBLICATIONS

Maharatna, K. et al., Virtually Scaling-Free Adaptive CORDIC Rotator, IEE Proc.-Comput. Digit. Tech., vol. 151, No. 6, Nov. 2004, pp. 448-456.

(Continued)

*Primary Examiner* — Jack Berman
*Assistant Examiner* — Wyatt Stoffa
(74) *Attorney, Agent, or Firm* — Reising Ethington P.C.

(57) ABSTRACT

A frequency measuring and control apparatus includes a plurality of synchronized oscillators integrated in parallel into one programmable logic device.

20 Claims, 4 Drawing Sheets

(56) References Cited

U.S. PATENT DOCUMENTS

| | | | |
|---|---|---|---|
| 6,411,075 B1* | 6/2002 | Battiston et al. | 324/76.39 |
| 6,608,307 B1* | 8/2003 | Baur | 250/306 |
| 7,326,923 B2* | 2/2008 | Berstis | 250/281 |
| 7,430,484 B2* | 9/2008 | Ohara | 702/75 |
| 7,521,257 B2* | 4/2009 | Adams et al. | 436/183 |
| 7,757,544 B2* | 7/2010 | Huang et al. | 73/105 |
| 8,643,440 B2* | 2/2014 | Kondo et al. | 331/46 |
| 2007/0163335 A1 | 7/2007 | Huang et al. | |
| 2007/0233413 A1* | 10/2007 | Ohara | 702/106 |
| 2008/0140343 A1* | 6/2008 | Roover et al. | 702/168 |
| 2009/0070904 A1* | 3/2009 | West et al. | 850/5 |
| 2009/0153204 A1* | 6/2009 | Kawamoto et al. | 327/157 |
| 2010/0134158 A1* | 6/2010 | Pignol et al. | 327/156 |
| 2010/0239033 A1* | 9/2010 | Shiue et al. | 375/260 |
| 2010/0310031 A1* | 12/2010 | Ballantyne et al. | 375/376 |
| 2012/0005621 A1* | 1/2012 | Kollin | 715/781 |

OTHER PUBLICATIONS

Nikolov, N. et al., All-digital PLL System for Self-oscillation Mode of Microcantilevers with Integrated Bimorph Actuator and Piezoresistive Readout, IFSA, vol. 98, Nov. 2008.

Andraka, Ray, High Performance Digital Down-Converters for FPGAs, Applications—Digital Radio, pp. 48-51.

Radic, Dejan, Aligning Carrier NCO Frequency, Intersil, Application Note, Aug. 2000, 2 pages.

Brandon, David, Synchronizing Multiple AD9852 DDS-Based Synthesizers, Application Note, Analog Devices, 2003, 7 pages.

Andersson, Anton, On Generating Complex Numbers For FFT and NCO Using the CORDIC Algorithm, Institutionen for Systemteknik, Linkopin, Nov. 2008, 69 pages.

Nonnenmacher, M. et al., Kelvin Probe Force Microscopy, Appl. Phys. Lett. 58 (25), Jun. 24, 1991, pp. 2921-2923.

Zerweck, Ulrich, et al., Accuracy and Resolution Limits of Kelvin Probe Force Microscopy, The American Physical Society, Physical Review, 2005, 9 pages.

Loppacher, Ch. et al., Fast Digital Electronics for Application in Dynamic Force Microscopy Using High-Q Cantilevers, Appl. Phys. A, vol. 66, 1998, pp. S215-S218.

The International Search Report and Written Opinion of the International Searching Authority, Application No. PCT/US11/028859, Filing date: Mar. 17, 2011, 8 pages.

* cited by examiner

FREQUENCY MEASURING AND CONTROL APPARATUS WITH INTEGRATED PARALLEL SYNCHRONIZED OSCILLATORS

CROSS-REFERENCE TO RELATED APPLICATION

This present application claims priority from PCT Patent Application PCT/US2011/28859 filed on Mar. 17, 2011 and U.S. Provisional Patent Application No. 61/315,823, filed Mar. 19, 2010, all of which are incorporated herein by reference in their entireties.

TECHNICAL FIELD

This disclosure relates generally to frequency measuring and control and, more particularly, to frequency control with phase locking.

BACKGROUND

Many technologies employ phase locked loops (PLLs). For example, in scanning probe microscopy, scientists use scanning probe microscopes (SPMs) to reveal data about various properties of materials, like gold or silicon, at very fine resolution down to molecules and atoms of the materials. SPMs are a family of ultra-high magnification instruments that include Scanning Tunneling Microscopes (STMs), Atomic Force Microscopes (AFMs), Near Field Scanning Optical Microscopes (NSOMs), among others. Non-contact SPMs include apertureless NSOMs, and Kelvin Probe Force Microscopes (KPFMs) which are non-contact variants of AFMs.

In one example, an SPM may include a flat support upon which a material specimen is placed, and a cantilever having a free end with a small sharp probe suspended above the specimen probe with a tip so fine it is about the size of a single atom. The SPM also may include a cantilever actuator to oscillate the cantilever in relation to the specimen, and one or more detectors to measure the oscillation of the cantilever. The SPM further may include a digital PLL to receive a cantilever oscillation signal from the oscillation detector(s) and an output reference oscillation signal from a reference oscillator. The digital PLL then determines a phase difference between the oscillation signals to generate a phase difference signal. The digital PLL next filters the phase difference signal, amplifies or attenuates the phase difference signal, and feeds the phase difference signal back as an input to the reference oscillator. The output signal of the reference oscillator is also coupled to a phase shifter to optimize resonance of the cantilever and is mixed with a cantilever excitation signal that is fed downstream to the electromechanical oscillator. As a result, the PLL responds to the oscillation input signals by automatically raising or lowering the frequency of the cantilever oscillator until the cantilever oscillates in fixed relation to the reference oscillator signal.

In non-contact modes of SPM, a cantilever may be oscillated at or close to its fundamental resonance frequency, and the amplitude, phase, and frequency of the oscillating cantilever may vary as a function of probe-sample interaction forces. Such variation in cantilever oscillation with respect to an external reference oscillation provides information about the characteristics of the specimen and is used to discriminate between different types of materials on the surface of the specimen.

In a particular example, digital PLL circuits are now used for non-contact AFM and offer superior stability and accuracy in frequency detection over analog PLL's. In this example, a reference oscillator of the PLL generates the reference signal, which is then mixed with a PLL input signal. Separately, an excitation signal is used to excite the cantilever. For example, the reference oscillator may be a numerically controlled oscillator (NCO) that has a normal output and a quadrature output. These outputs can then be summed to generate a phase shift. But the disadvantage of this configuration is that it is not possible to run cantilever excitation and PLL detection at harmonic frequencies of each other. They must be the same.

In another example, involving KPFM or apertureless NSOM applications, additional lock-in amplifiers are used to analyze the same signals in parallel to the PLL. These applications involve detection of integer or rational multiples of the PLL reference frequency as well as fixed offsets from a fluctuating base cantilever frequency. For instance, two lock-In amplifiers can be run in parallel to a PLL detector. But such a configuration is considerably costly for each additional lock-in, and runs on an external reference. Modern digital lock-ins generate the reference using a PLL with very low time constant and, thus, cannot handle constant changes in frequency very well. In any event, it is not possible with such a configuration to provide a fixed offset from the fluctuating PLL reference frequency or a harmonic thereof.

Frequency generation in digital PLL's is based on the Direct Digital Synthesis (DDS) principle, and hybrid approaches include using analog mixers with digital reference frequency generators. Synchronization between DDS phase accumulators can be achieved by sending synchronization pulses on zero crossings from a master phase accumulator where a synched phase accumulator is held until the master signal crosses zero. In one implementation, two DDS chips are run in parallel on the same clock and on the same data bus. But this design does not permit setting up the two DDS chips with different frequencies as is required for detecting or exciting relatively high harmonics.

Finally, with analog PLL circuits, although it is possible to create integer and fractional multiples of a base frequency with frequency dividers between a VCO and a mixer, it is complicated to build a variable frequency ratio frequency multiplier this way and it is impossible to have the circuit output pure sine waves this way.

BRIEF SUMMARY

One exemplary embodiment of a frequency measuring and control apparatus includes a plurality of synchronized oscillators integrated in parallel into one programmable logic device.

DETAILED DESCRIPTION

In general, an electronic frequency measuring and controlling apparatus will be described using one or more examples of exemplary embodiments of multiple synchronized oscillators. The example embodiment(s) will be described with reference to its use in an SPM environment. However, it will be appreciated as the description proceeds that the invention is useful in many different applications and may be implemented in many other embodiments. In this regard, and as used herein and in the claims, it will be understood that the term "system" refers not only to SPM applications, but also to any other suitable applications.

Figure 1:
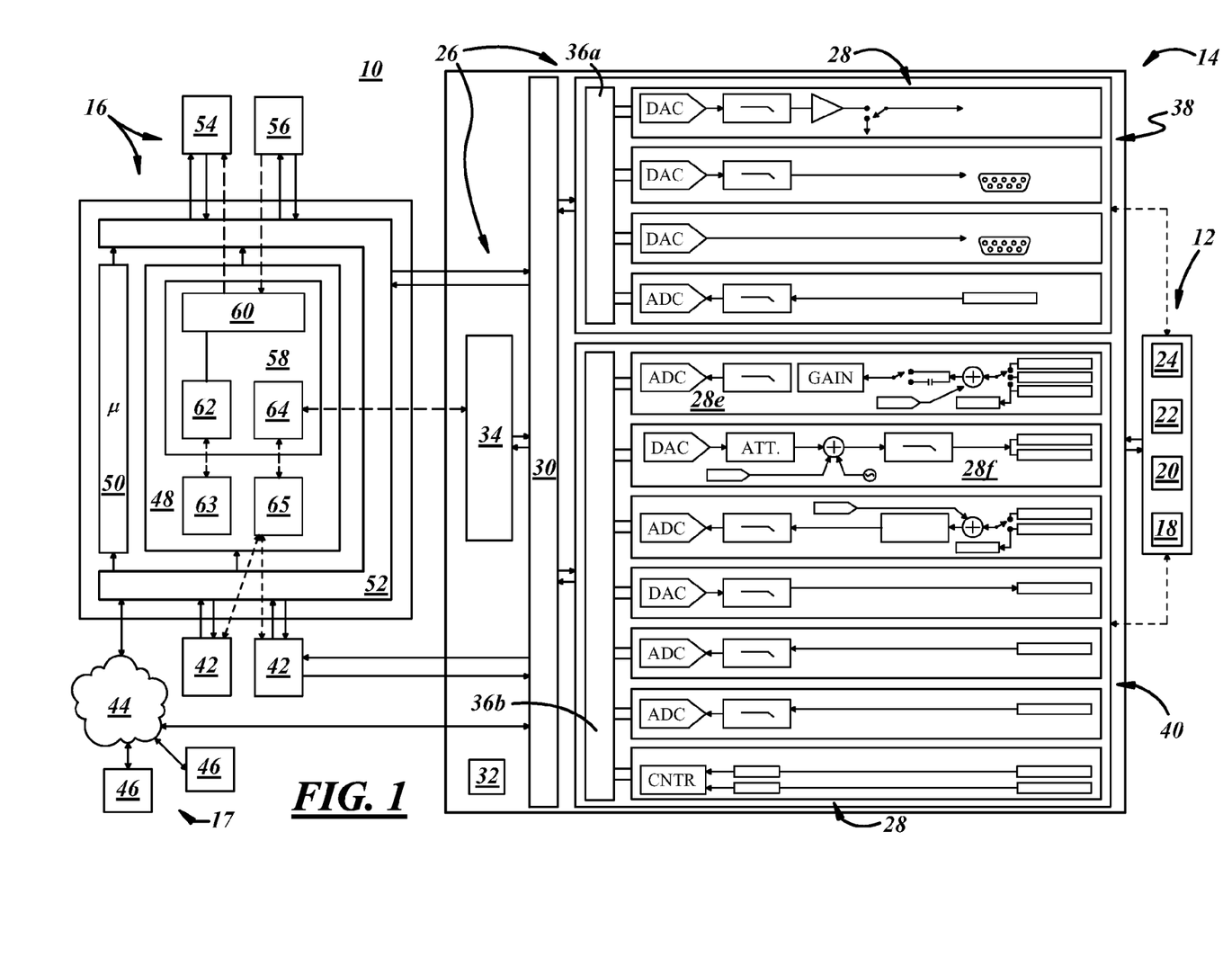

Referring specifically to the drawings, FIG. 1 illustrates an exemplary embodiment of an SPM system 10, which generally may include probe equipment 12 to interact with a material of interest, electronic instrumentation 14 to interact with the probe equipment 12, a computer 16 to interact between the instrumentation 14 and a user, and system peripherals 17 to interact with the instrumentation 14, the computer 12, and/or the user. The SPM system 10 may include, but is not limited to AFM, STM, NSOM, or any other type of SPM system.

The probe equipment 12 may be used, for example, to experiment with a specimen under investigation, to manipulate portions of a workpiece being modified, or for any other suitable purpose. In the illustrated embodiment, the probe equipment 12 may include a base 18 to support the material of interest, and one or more probes 20 to contact the material of interest or otherwise interrogate the material of interest. The probe equipment 12 also may include one or more actuators 22 controlled by the instrumentation 14 to move the base 18 and/or the probe(s) 20, and one or more sensors 24 monitored by the instrumentation 14 to sense any suitable parameters associated with the probe(s) 20 or other elements of the probe equipment 12.

The instrumentation 14 may be used, for example, to control and monitor parameters of the SPM equipment 12. In this regard, the instrumentation 14 may be used, for example, for any detection, observation, measurement, control, computation, communication, data processing, and/or the like. The instrumentation 14 generally may include firmware-usable elements or programmable hardware 26, other instrumentation hardware 28, and a communications bus 30 in communication between the programmable hardware 26 and the computer 16. Further, the instrumentation 14 may include a single system clock 32 with a dedicated clock distribution circuit (not separately shown). The single clock 32 may enable good precision by providing exact phase synchronization of all excitation and detector reference signals. Also, use of the single clock 32 may eliminate amplification of clock jitter when clock signals are multiplied and distributed through programmable logic devices. Further, the single clock 32 may eliminate loss of phase accuracy ordinarily inherent in systems having multiple separate instrumentation units.

As used herein, the terminology system hardware may include the instrumentation 14 and one or more of the probe(s) 20, actuator(s) 22, and sensor(s) 24.

The programmable hardware 26 may include components that may be configured and programmed, either alone or in combination with the other hardware 28, to provide specific digital real time deterministic hardware components (phase locked loops, lock in detectors, signal filters, signal multipliers and adders, and etc.) and signal processing services. For example, the programmable hardware 26 may include at least one digital signal processor (DSP) 34 and one or more reconfigurable or programmable logic devices (PLDs) 36a, 36b that may be used to process digital signals according to device configurations that may be set during software program runtime.

The DSP 34 may be used to process digital signals converted from analog signals received by the instrumentation 14 from the probe equipment 12 and to process digital signals from the computer 16 and peripherals 17 for conversion to analog signals transmitted from the instrumentation 14 to the probe equipment 12. Any suitable DSP may be used.

The PLDs 36a, 36b may include, for example, field-programmable gate arrays (FPGA's), complex programmable logic devices (CPLD's), or any other suitable programmable or reconfigurable electronic devices. Any PLD may be used, for example, an FPGA.

The other hardware 28 may be non-programmable and may include, for example, analog and digital input and output channels, analog amplifiers, analog filters, signal combiners, power conditioners at various voltages, analog-to-digital converters (ADCs), digital-to-analog converters (DACs), channel multiplexers, pulse counting channels, and communications hardware to route various signals through the hardware and to route various signals between the programmable hardware 26 and any external or peripheral hardware.

The programmable hardware 26 may be programmed to provide synchronous real time deterministic excitation and response signal controls and deterministic real time signal processing of mixed analog and digital signals received from the probe equipment 12 and any other peripheral equipment that may be connected to the hardware 28.

The system peripherals 17 may include, for example, one or more peripheral instruments 42, one or more networks 44, and one or more remote computers 46. The peripheral instruments 42 may include, for example, peripheral oscilloscopes, multimeters, or any other suitable instrumentation that a system user may desire to use, for example, to supplement the system instrumentation 14. The one or more networks 44 may include, for example, local area networks (LANs), wide area networks (WANs), or any other suitable networks. The network(s) 44 may be wired, wireless, or a combination thereof, and may be intranets, extranets, and/or global computer networks (e.g., the Internet or World Wide Web). The remote computers 46 may be any suitable devices to receive, process, store, and transmit data to and from the system computer 16. The remote computers 46 may include, for example, personal computers, servers, routers, network PCs, peer devices, other common network nodes, and/or the like, and typically include their own versions of many or all of the internal and external or peripheral elements described below relative to the computer 16. In a networked environment, software modules and/or data used by the computers 46, or portions thereof, may be stored in the remote computers 46 or remote memory storage devices associated therewith or connected thereto. By way of example, and not limitation, remote application programs/data may reside in memory of the remote computers 46.

The system computer 16 may be used, for example, to receive input data and instructions from a user, process the received data and instructions in light of stored data and software, and communicate output signals to the instrumentation 14 for use in operating the probe equipment 12. Conversely, in another example, the computer 16 may be used to receive input signals from the instrumentation 14, process the received input signals in light of the stored data and software, and communicate output data to the user. The computer 16 may be combined with the instrumentation 14 as an integrated product, or may be separate from the instrumentation 14.

The exemplary system computer 16 may include memory 48, one or more processors 50, one or more communications devices 52, one or more user input devices 54, and one or more user output devices 56. Of course, the computer 16 may include any ancillary devices, for example, clocks, power supplies, and the like (not separately shown). The user input devices 54 may include, for example, a pointing device (e.g., a mouse, trackball, pen, touch pad, touchscreen, joystick, or the like), keyboard, microphone, and/or the like, and may be used to enter any suitable commands or instructions and data or information into the processor(s) 50. The user output device(s) 56 may include, for example, a printer, monitor, or any other type of display device, speakers, and/or the like.

In general operation of the computer 16, the processor 50 may be powered by a power supply (not shown) and may initially operate on, for example, BIOS instructions stored in memory 48. The processor 50 receives commands or data from any input device(s) 14, 42, 46, 54, and receives, processes, and stores data or instructions from various storage media including the internal memory 48 and through any suitable memory interface, and outputs data or instructions to any output devices 14, 42, 46, 56. Generally, data processors of computers are programmed to carry out computer-executable instructions, such as those associated with or embedded in software or computer programs such as operating systems, application programs, and the like.

The communications device(s) 52 may include a bus, which may provide for data transmission internally between each of the elements in the computer 16, and externally between the internal elements of the computer 16 and any other elements external of the computer 16. The bus may include one or more of any of several types of bus structures, including a memory bus or memory controller, a peripheral bus, an accelerated graphics port, a processor or local bus and using any of a variety of bus architectures. The communications device(s) 52 may also include devices that conform to various protocols including RS-232, parallel, small computer system interface, universal serial bus, and/or any other suitable protocol(s).

The processor(s) 50 may be configured to process data and execute control logic that provides at least some of the functionality of the system 10. In this respect, the processor(s) 50 may include, for example, one or more processing units, controllers, microprocessors, micro-controllers, discrete logic circuit(s) having logic gates for implementing logic functions upon data signals, application specific integrated circuits (ASIC) with suitable logic gates, complex programmable logic devices (CPLD), programmable or field-programmable gate arrays (PGA/FPGA), any combinations of the aforementioned, and the like.

The memory 48 may include any computer readable medium or media configured to provide at least temporary storage of data and/or computer software or computer-readable instructions that provide at least some of the functionality of the system and that may be executed by the processor. The memory 48 may be in the form of removable and/or non-removable, volatile memory and/or non-volatile memory.

Exemplary volatile memory may include, for example, random access memory (RAM), static RAM (SRAM), dynamic RAM (DRAM) including synchronous or asynchronous DRAM, and/or the like, for running software and data on the processor. By way of example, and not limitation, the volatile memory may include an operating system, application programs, other memory modules, and data.

Exemplary non-volatile memory may include, for example, read only memory (ROM), erasable programmable ROM (EPROM), electrically erasable programmable ROM (EEPROM), dynamic read/write memory like magnetic or optical disks or tapes, and static read/write memory like flash memory, for storing software and data. Although not separately shown, the computer may also include other removable/non-removable volatile/non-volatile data storage or media. For example, the other media may include dynamic or static external storage read/write device(s).

The memory discussed above enable storage and communication of computer readable instructions, data structures, program modules, and other data for the computer 16. The memory 48 may store an operating system or program, application programs, and/or other program modules and program data that may reside at various times in different storage mediums associated with the computer 16. For example, the memory 48 may store at least a portion of a program to define digital oscillators, which are described in further detail below.

Figure 2:
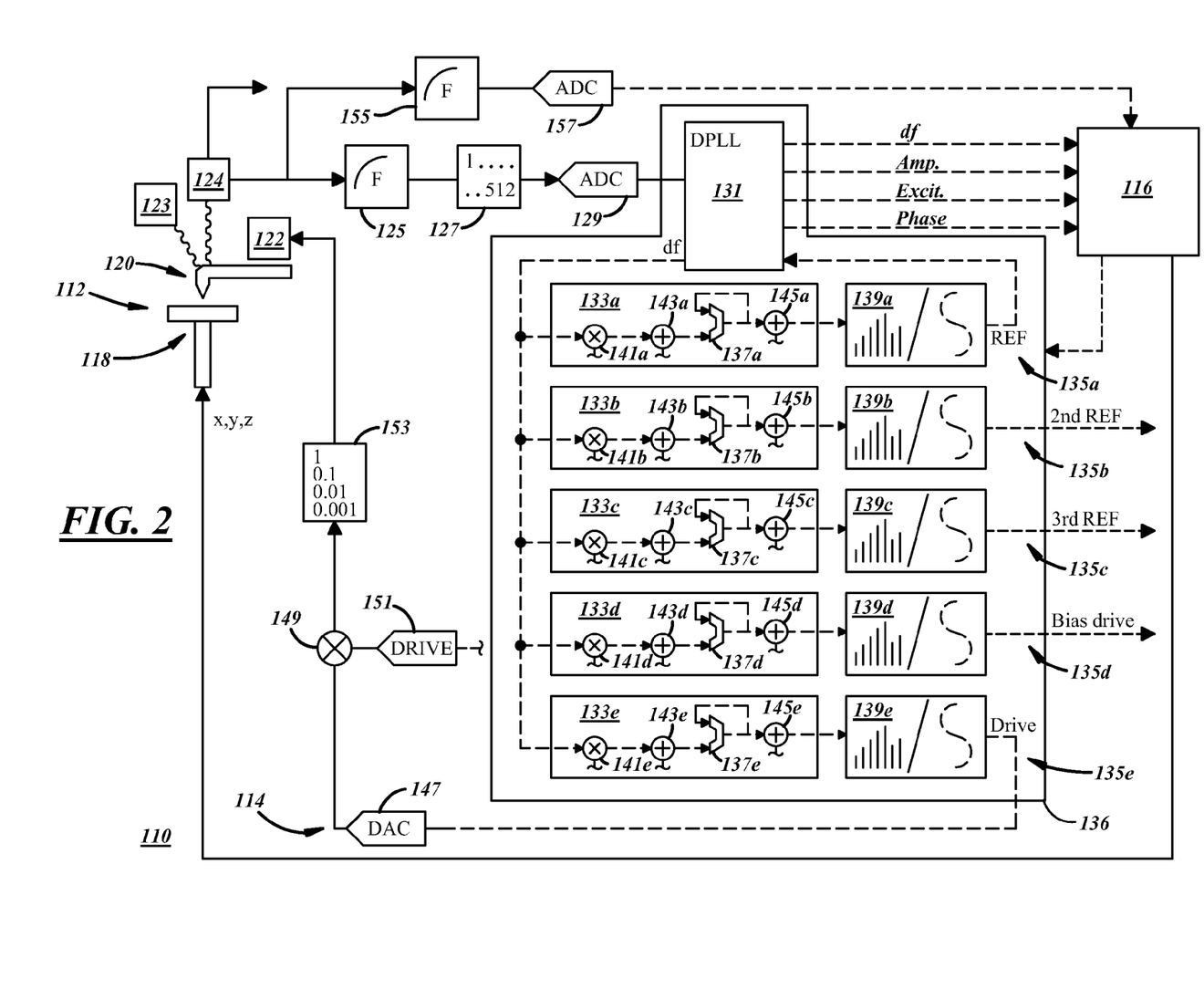

FIG. 2 illustrates another exemplary embodiment of a system 110, which may be an SPM system. This embodiment is similar in many respects to the embodiment of FIG. 1 and like numerals between the embodiments generally designate like or corresponding elements throughout the several views of the drawing figures. Additionally, the descriptions of the embodiments are incorporated by reference into one another and the common subject matter generally may not be repeated here.

The system 110 includes probe equipment 112 to interact with a material of interest, electronic instrumentation 114 in communication with the probe equipment 112, and a computer 116 to interact between the instrumentation 114 and a user.

The probe equipment 112 may include a base 118 to support the material of interest, and a cantilever probe 120 to contact the material of interest or otherwise interrogate the material of interest. The probe equipment 112 also may include a probe actuator 122 coupled to the probe 120 to oscillate the probe 120, and an oscillation sensor 124 to sense oscillation of the oscillating probe 120 and generate an analog oscillation signal corresponding to the sensed oscillation of the oscillating probe 120. The probe equipment 112 further may include one or more auxiliary oscillation sensors 123.

The instrumentation 114 transmits excitations to the equipment 112 and receives responses produced by the equipment 112. The instrumentation 114 includes a filter 125, an amplifier 127, and an analog-to-digital converter 129 in downstream communication with the oscillation sensor 124 to convert the analog oscillation signal to a digital oscillation signal for receipt by a digital phase locked loop 131. The instrumentation 114 also includes a programmable logic device 136 in communication with the analog-to-digital converter 129 and is configured to define the phase locked loop 131 to compare the digital oscillation signal from the converter 129 with a digital reference oscillation signal and generate a digital phase difference signal $d_f$. Any suitable digital PLL may be used, and may output the phase difference signal $d_f$, an amplitude signal, an excitation signal, and a phase signal to the computer 116 for any suitable purpose, for example, to control movement of the support 118.

Also, the PLD 136 is configured to define a plurality of integrated, parallel, synchronized oscillators 133 corresponding to a plurality of channels 135. The oscillators 133 are integrated into the single PLD 136, are arranged in parallel, and are synchronized by a single clock and by synchronization factors as will be discussed below. The plurality of oscillators 133 are in downstream communication with the phase locked loop 131 to receive the digital phase difference signal $d_f$. The oscillators 133 include a plurality of phase accumulators 137 to generate a plurality of digital phase signals for the corresponding plurality of channels 135. The oscillators 133 also include a plurality of phase-to-amplitude converters 139 downstream of the plurality of phase accumulators 133 to convert the plurality of digital phase signals into a plurality of digital amplitude signals.

The plurality of channels 135 includes a PLL reference channel 135a, and a probe drive channel 135b, and may also include other reference channels, for example, second and third oscillation detector channels 135c, 135d, and a bias drive channel 135e. The plurality of phase accumulators 137 includes a reference phase accumulator 137a and the plurality of phase-to-amplitude converters 139 includes a reference phase-to-amplitude converter 139a to generate the digital reference oscillation signal for the PLL reference channel 135a. The plurality of phase accumulators 137 also includes a drive phase accumulator 137e and the plurality of phase-toamplitude converters 139 also includes a drive phase-to-amplitude converter 139e to generate a digital drive oscillation signal for the drive channel 135e. Also, the plurality of phase accumulators 137 may include a second reference phase accumulator 137b and the plurality of phase-to-amplitude converters 139 may include a second reference phase-to-amplitude converter 139b to generate a second reference oscillation signal for the second reference channel 135b. Further, the plurality of phase accumulators 137 may include a third reference phase accumulator 137c and the plurality of phase-to-amplitude converters 139 may include a third reference phase-to-amplitude converter 139c to generate a third reference oscillation signal for the third reference channel 135c. Additionally, the plurality of phase accumulators 137 also may include a bias drive phase accumulator 137d and the plurality of phase-to-amplitude converters 139 may include a bias drive phase-to-amplitude converter 139d to generate a bias drive oscillation signal for the bias drive channel 135d.

Further, the PLD 136 is configured to apply a plurality of channel-specific synchronization factors to the digital phase difference signal upstream of the phase accumulators 137. For example, the PLD 136 may be configured to define mixers 141a-e to mix the channel-specific synchronization factors with the $d_f$ signal. The channel-specific synchronization factors enable the different channels 135 to be run at integer or non-integer harmonics of one another or to uncouple one or more of the channels 135 from the $d_f$ signal. For instance, it may be desirable to double or triple a digital amplitude signal output from one of the channels 135, for example, to accurately monitor, via one of the second or third reference channels 135b, 135c, the auxiliary oscillation detector 123, which may be monitoring some other harmonics of the probe 120. The synchronization factors may be applied to the PLD 136 via the computer 116, which may receive from a user the synchronization factors by way of any suitable input device.

Also, the PLD 136 may be configured to apply a plurality of channel-specific frequency offsets to the digital phase difference signal upstream of the phase accumulators 137 and downstream of the application of the plurality of synchronization factors. For example, the PLD 136 may be configured to define adders 143 to sum the channel-specific frequency offsets with the factored or unfactored $d_f$ signal. The channel-specific frequency offsets enable the different channels 135 to be run with adjustments to or differentials in frequency from one another. For instance, it may be desirable to increase a digital amplitude signal output from one of the channels, for example, to account for an increased bias voltage frequency in monitoring the bias reference channel 135d.

Further, the PLD 136 may be configured to apply a plurality of channel-specific phase offsets to output signals from the phase accumulators 137. For example, the PLD 136 may be configured to define adders 145 to sum the channel-specific phase offsets with the phase accumulator signals. The channel-specific phase offsets enable the different channels 135 to be run with adjustments to or differentials in phase from one another.

The instrumentation 114 also includes a digital-to-analog converter 147 in communication with the PLD 136 to receive and convert the digital drive oscillation signal from the drive oscillation channel 135e into an analog drive oscillation signal. The instrumentation 114 further includes a mixer 149 to mix the analog drive oscillation signal with an analog amplitude drive signal from a DAC 151, which receives and converts a digital amplitude drive signal from the computer 116. The instrumentation 114 additionally includes an attenuator 153 coupled in downstream communication with the mixer 149 and in upstream communication with the probe actuator 122 for communication with the probe actuator 122 to attenuate the signal from the mixer 149 to the actuator 122.

Finally, the system 110 may also include a filter 155 coupled in downstream communication to the oscillation sensor 124 and an analog-to-digital converter 157 downstream of the filter 155. The filter 155 and ADC 157 provide a reference signal to the computer 116.

Figure 3:
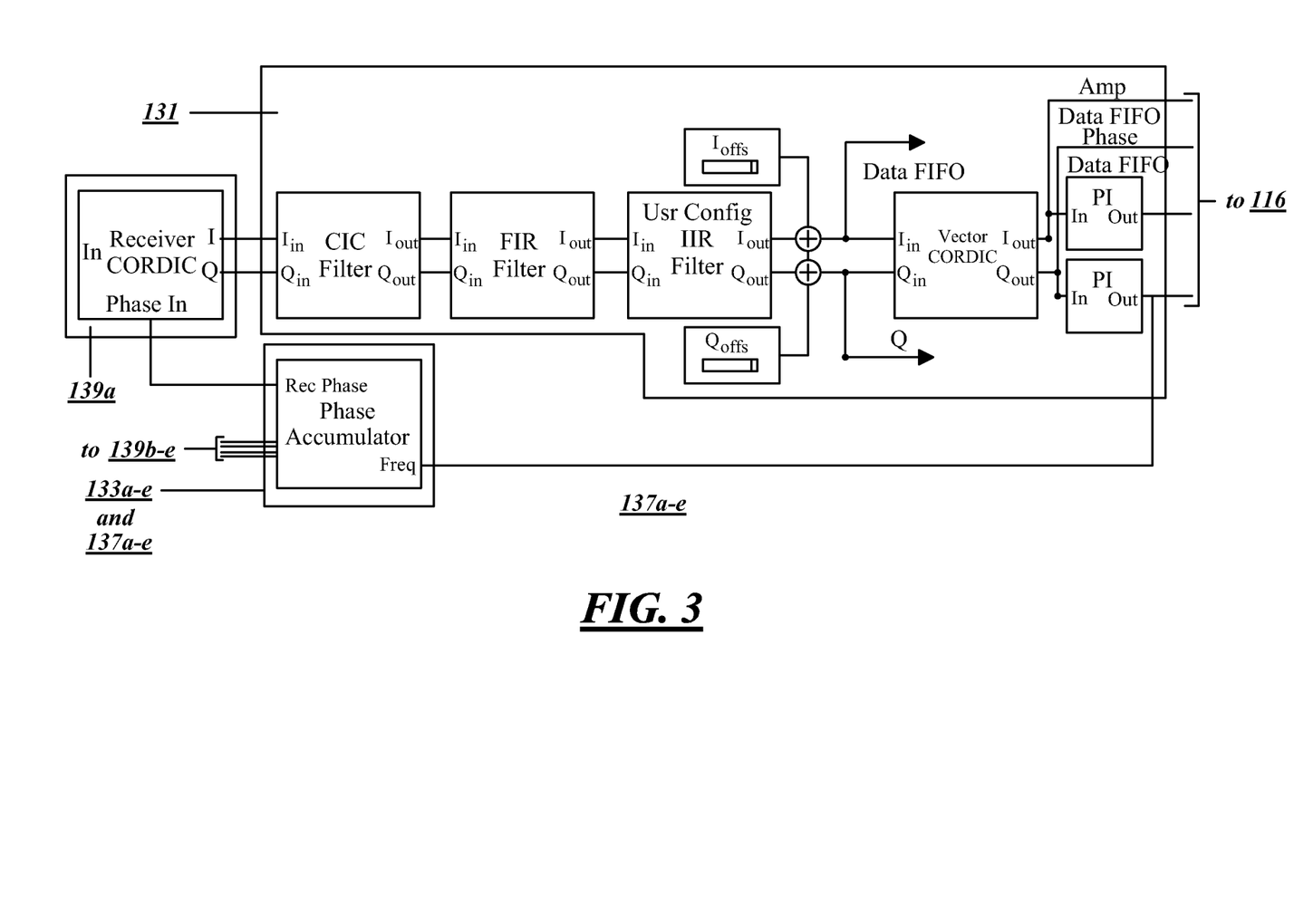
Figure 4:
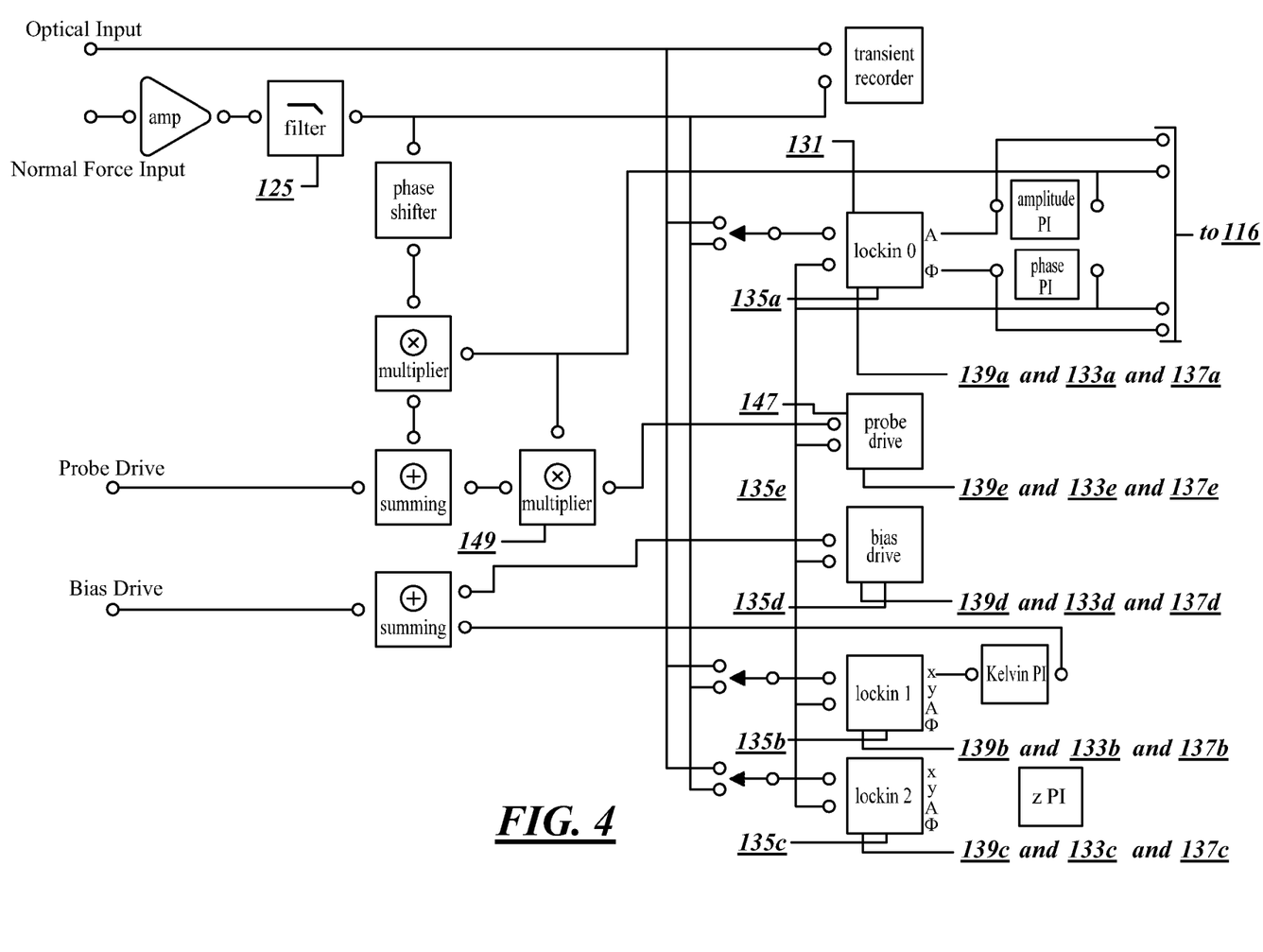

With reference particularly to FIGS. 3 and 4, the illustrated embodiment permits synchronizing of multiple phase channels of information for the purposes of coordinated high precision signal processing that incorporates the VHDL structures comprising the combinations of 133, 137 and 139 including specifically the multiplication units and the summing junctions. This novel VHDL structure makes possible precision and flexibility in signal processing especially when real world components with non-integer harmonics are being considered.

This new structure allows for dissimilar phase slopes and phase offset signals to be processed easily and with high precision of synchronization.

In addition to these combination of structures 133, 137 and 139, the inputs to the multipliers and summing junctions may be connected to the outputs of the 139 type this creates the possibilities of highly efficient hardware in the loop simulations by creating with some extra logic real time ordinary differential equation solvers that operate in the megahertz frequency range with greater than 18 bit resolution. This capability is needed for advanced HIL (hardware in the loop) simulations and model reference adaptive controllers that will enable significant speed and precision improvements for hybrid equipment design and testing.

Further in addition to the use of outputs of these devices as inputs to various parameter ports, the addition of a real time arithmetic unit like 116 that can parametrically change the values at these inputs also enables entirely new processing constructions.

A specific example implementing these new structures and a computational tool is shown in the accompanying block diagrams. The 133, 137 and 139 structures are labeled. The computational unit is 116 is not shown in this unit, but the signal paths out to it are indicated. The symbols on 133, 137 and 139 structures indicate wiring lines implicitly leading to other 139 or 116 type components.

For purposes of this disclosure, the system computer(s) 16, 116 may include any instrumentality or aggregation of instrumentalities operable to compute, classify, detect, display, handle, originate, manipulate, manifest, process, record, reproduce, receive, retrieve, switch, store, or utilize any form of data, information, intelligence for academic, business, production, scientific, or any other purposes. Although described in connection with an exemplary computing system environment, including a computer, the disclosed system 10 and methods may be operational with numerous other general purpose or special purpose computing system environments or configurations. The computing system environment is not intended to suggest any limitation as to the scope of use or functionality of the system or method. Moreover, the computing system environment should not be interpreted as having any dependency or requirement relating to any one component, or combination of components, illustrated in the exemplary operating environment. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, personal digital assistants, mobile telephones, network PCs, minicomputers, mainframe computers, distributed computing environments that include any of the above systems or devices, and the like.

As mentioned previously, the computer(s) 16, 116 may be adapted to use at least some form of computer readable media, which may include volatile and/or non-volatile media, removable and/or non-removable media, and which may be any suitable medium that may be accessed by a computer. The medium may contain, store, and/or carry instructions or programs for implementing some or all of the method steps described below in conjunction with the processor or other data processor. At least some portion of the presently disclosed methods may be practiced locally or in a distributed computing environment where tasks may be performed by remote computers or processing devices that are linked through a communications network, such as the LAN, WAN, or the like. In a distributed computing environment, program modules may be located in both local and remote computer storage media including memory storage devices.

Computer storage media may be used to distribute computer programs locally and may include volatile and nonvolatile, removable and non-removable media implemented in any method or technology for storage of information such as computer readable instructions, program modules, data structures, other data, and the like. More specifically, computer storage media may include RAM, ROM, EEPROM, flash memory or memory sticks, integrated circuits, CD-ROM, digital versatile disks (DVD) or other optical disk storage, magnetic cassettes, magnetic tape, magnetic disk storage or other magnetic storage devices, or any other medium that may be used to store the desired information and that may be accessed by the computer(s) 16, 116.

The methods described above may be performed as one or more computer programs and the various data may be stored in memory as a look-up table or the like. Computer programs or software may include executable instructions for implementing logical functions and can be embodied in any computer-readable medium for use by or in connection with a processor that can retrieve and execute the instructions. The software may include, but is not limited to routines, modules, objects, components, data structures, and the like, for performing particular tasks and/or implementing particular abstract data types. Computer programs may exist in a variety of forms both active and inactive. General examples include software programs comprised of instructions in source code, object code, executable code or other formats; firmware programs; or hardware description language (HDL) files; and the like. Specific examples include assembler, C, C++ objects, Visual Basic, Visual C++, XML, UML, Java, and Microsoft® Foundation Classes, Microsoft.net, visual.net, PERL, PHP, SQL, and the like. Any of the above can be embodied on a computer usable medium, which include one or more storage devices and/or signals, in compressed or uncompressed form. Exemplary computer usable storage devices include conventional computer system RAM (random access memory), ROM (read only memory), EPROM (erasable, programmable ROM), EEPROM (electrically erasable, programmable ROM), and magnetic or optical disks or tapes.

As used in the sections above and claims below, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components, elements, or items. Similarly, when introducing elements of the invention or the example embodiments thereof, the articles "a," "an," "the," and "said" are intended to mean that there are one or more of the elements. Moreover, directional words such as front, rear, top, bottom, upper, lower, radial, circumferential, axial, lateral, longitudinal, vertical, horizontal, transverse, and/or the like are employed by way of description and not limitation. Other terms are to be construed using their broadest reasonable meaning unless they are used in a context that requires a different interpretation.

Finally, the foregoing description is not a definition of the invention, but is a description of one or more examples of exemplary embodiments of the invention. The statements contained in the foregoing description relate to the particular examples and are not to be construed as limitations on the scope of the invention as claimed below or on the definition of terminology used in the claims, except where terminology is expressly defined above. And although the present invention has been disclosed using a limited number of examples, many other examples are possible and it is not intended herein to mention all of the possible manifestations of the invention. In fact, other modifications, variations, forms, ramifications, substitutions, and/or equivalents will become apparent to those skilled in the art in view of the foregoing description. The present invention is intended to embrace such forms, ramifications, modifications, variations, substitutions, and/or equivalents as fall within the spirit and broad scope of the following claims. In other words, the present invention encompasses many substitutions or equivalents of limitations recited in the following claims. Therefore, the invention is not limited to the particular examples of exemplary embodiments disclosed herein, but instead is defined solely by the claims below.

The invention claimed is:

1. An electronic frequency measuring and control apparatus, comprising:
   an oscillating element;
   an oscillation sensor to sense oscillation of the oscillating element and generate an analog oscillation signal corresponding to the sensed oscillation of the oscillating element;
   an analog-to-digital converter in communication with the oscillation sensor to convert the analog oscillation signal to a digital oscillation signal; and
   a phase locked loop to compare the digital oscillation signal from the analog-to-digital converter with a digital reference oscillation signal and generate a digital phase difference signal; and
   a plurality of oscillators in parallel downstream communication with the phase locked loop to receive the digital phase difference signal, wherein the oscillators include a plurality of phase accumulators to generate a plurality of digital phase signals for a corresponding plurality of channels and a plurality of phase-to-amplitude converters downstream of the phase accumulators to convert the plurality of digital phase signals into a plurality of digital amplitude signals for the corresponding plurality of channels;
   wherein the phase locked loop and the plurality of oscillators are defined by a single programmable logic device in communication with the analog-to-digital converter and configured to apply a plurality of channel-specific synchronization factors to the digital phase difference signal upstream of the phase accumulators.

2. The apparatus of claim 1, wherein the programmable logic device is also configured to apply a plurality of channel-specific frequency offsets to the digital phase difference signal upstream of the phase accumulators and downstream of the application of the plurality of synchronization factors.

3. The apparatus of claim 1, wherein the programmable logic device is also configured to apply a plurality of channel-specific phase offsets downstream of the phase accumulators and upstream of the phase-to-amplitude converters.

4. The apparatus of claim 1, wherein the plurality of phase accumulators includes a reference phase accumulator for a reference channel and the plurality of phase-to-amplitude converters includes a reference phase-to-amplitude converter to generate the digital reference oscillation signal for the reference channel.

5. The apparatus of claim 4 wherein the plurality of phase accumulators includes a drive phase accumulator for a drive channel and the plurality of phase-to-amplitude converters includes a drive phase-to-amplitude converter to generate a digital drive oscillation signal for the drive channel.

6. The apparatus of claim 5, further comprising a digital-to-analog converter in communication with the programmable logic device to convert the digital drive oscillation signal into an analog drive oscillation signal.

7. The apparatus of claim 6, further comprising a mixer in communication with the digital-to-analog converter to mix the analog drive oscillation signal with an analog drive amplitude signal to generate a mixed analog drive oscillation signal.

8. The apparatus of claim 7, further comprising an actuator in communication with the oscillating element to oscillate the oscillating element, and an attenuator coupled in downstream communication with the mixer and in upstream communication with the actuator to attenuate the mixed analog drive oscillation signal.

9. A computer-controlled SPM system, comprising:
equipment to carry out scanning probe microscopy, and including:
a probe;
an actuator in communication with the probe to oscillate the probe; and
an oscillation sensor to sense oscillation of the oscillating probe and generate an analog oscillation signal corresponding to the sensed oscillation of the oscillating probe;
instrumentation in communication with the equipment to transmit excitations to the equipment and receive responses produced by the equipment, and including:
a digital-to-analog converter in communication with the actuator;
an analog-to-digital converter in communication with the oscillation sensor to convert the analog oscillation signal to a digital oscillation signal; and
a phase locked loop to compare the digital oscillation signal from the analog-to-digital converter with a digital reference oscillation signal and generate a digital phase difference signal; and
a plurality of oscillators in parallel downstream communication with the phase locked loop to receive the digital phase difference signal, wherein the oscillators include a plurality of phase accumulators to generate a plurality of digital phase signals for a corresponding plurality of channels and a plurality of phase-to-amplitude converters downstream of the phase accumulators to convert the plurality of digital phase signals into a plurality of digital amplitude signals for the corresponding plurality of channels;
wherein the phase locked loop and the plurality of oscillators are defined by a single programmable logic device in communication with the analog-to-digital converter and configured to apply a plurality of channel-specific synchronization factors to the digital phase difference signal upstream of the phase accumulators; and
a computer in communication with the instrumentation and including at least one input device to receive from a user the plurality of channel-specific synchronization factors.

10. The system of claim 9, wherein the programmable logic device is also configured to apply a plurality of channel-specific frequency offsets to the digital phase difference signal upstream of the phase accumulators and downstream of the application of the plurality of synchronization factors.

11. The system of claim 9, wherein the plurality of phase accumulators includes a reference phase accumulator for a reference channel and the plurality of phase-to-amplitude converters includes a reference phase-to-amplitude converter to generate the digital reference oscillation signal for the reference channel.

12. The system of claim 11 wherein the plurality of phase accumulators includes a drive phase accumulator for a drive channel and the plurality of phase-to-amplitude converters includes a drive phase-to-amplitude converter to generate a digital drive oscillation signal for the drive channel.

13. The system of claim 12, further comprising a digital-to-analog converter in communication with the programmable logic device to convert the digital drive oscillation signal into an analog drive oscillation signal.

14. The system of claim 13, further comprising a mixer in communication with the digital-to-analog converter to mix the analog drive oscillation signal with an analog drive amplitude signal to generate a mixed analog drive oscillation signal.

15. The system of claim 14, further comprising an actuator in communication with the oscillating element to oscillate the oscillating element, and an attenuator coupled in downstream communication with the mixer and in upstream communication with the actuator to attenuate the mixed analog drive oscillation signal.

16. An electronic frequency measuring and control apparatus, comprising:
an analog-to-digital converter to convert an analog oscillation signal to a digital oscillation signal; and
a phase locked loop to compare the digital oscillation signal from the analog-to-digital converter with a digital reference oscillation signal and generate a digital phase difference signal; and
a plurality of oscillators in parallel downstream communication with the phase locked loop to receive the digital phase difference signal, wherein the oscillators include a plurality of phase accumulators to generate a plurality of digital phase signals for a corresponding plurality of channels and a plurality of phase-to-amplitude converters downstream of the phase accumulators to convert the plurality of digital phase signals into a plurality of digital amplitude signals for the corresponding plurality of channels;
wherein the phase locked loop and the plurality of oscillators are defined by a single programmable logic device in communication with the analog-to-digital converter and configured to apply a plurality of channel-specific synchronization factors to the digital phase difference signal upstream of the phase accumulators.

17. The apparatus of claim 16, wherein the programmable logic device is also configured to apply a plurality of channel-specific frequency offsets to the digital phase difference signal upstream of the phase accumulators and downstream of the application of the plurality of synchronization factors.

18. The apparatus of claim 16, wherein the programmable logic device is also configured to apply a plurality of channel-specific phase offsets downstream of the phase accumulators and upstream of the phase-to-amplitude converters.

19. The apparatus of claim 16, wherein the plurality of phase accumulators includes a reference phase accumulator for a reference channel and the plurality of phase-to-amplitude converters includes a reference phase-to-amplitude converter to generate the digital reference oscillation signal for the reference channel, and wherein the plurality of phase accumulators includes a drive phase accumulator for a drive channel and the plurality of phase-to-amplitude converters includes a drive phase-to-amplitude converter to generate a digital drive oscillation signal for the drive channel.

20. The apparatus of claim 16, further comprising a digital-to-analog converter in communication with the programmable logic device to convert the digital drive oscillation signal into an analog drive oscillation signal, and a mixer in communication with the digital-to-analog converter to mix the analog drive oscillation signal with an analog drive amplitude signal to generate a mixed analog drive oscillation signal.

\* \* \* \* \*